United States Patent
Nieman et al.

(10) Patent No.: US 7,224,588 B2
(45) Date of Patent: *May 29, 2007

(54) CARD GUIDE AND METHOD FOR USE IN GUIDING CIRCUIT BOARD WITH RESPECT TO CHASSIS

(75) Inventors: Mathew A. Nieman, Newfields, NH (US); Doreen DePalma Burns, Tyngsboro, MA (US); John Scott Whitney, Chelmsford, MA (US)

(73) Assignee: Starent Networks, Corp., Tewksbury, MA (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/230,255

(22) Filed: Sep. 19, 2005

(65) Prior Publication Data

US 2006/0056164 A1 Mar. 16, 2006

Related U.S. Application Data (63) Continuation of application No. 10/642,110, filed on Aug. 15, 2003, now Pat. No. 6,980,440.

(60) Provisional application No. 60/404,229, filed on Aug. 16, 2002.

(51) Int. Cl.
*H05K 7/14* (2006.01)
*H05K 7/20* (2006.01)

(52) U.S. Cl. .................. 361/802; 361/741; 361/756; 439/377

(58) Field of Classification Search ............... 361/756, 361/752, 796, 730, 728, 741, 801, 802, 678, 361/689, 788; 439/377; 211/41.17
See application file for complete search history.

(56) References Cited

U.S. PATENT DOCUMENTS

| | | | |
|---|---|---|---|
| 3,878,438 A | 4/1975 | Weisman | |
| 4,171,859 A | 10/1979 | Altoz et al. | |
| 5,210,680 A | 5/1993 | Scheibler et al. | |
| 5,339,221 A * | 8/1994 | Conroy-Wass et al. | 361/796 |
| 6,008,995 A * | 12/1999 | Pusateri et al. | 361/796 |
| 6,047,836 A | 4/2000 | Miles | |
| 6,359,788 B1 | 3/2002 | Giese et al. | |
| 6,377,470 B1 * | 4/2002 | Hayward et al. | 361/796 |
| 6,381,147 B1 | 4/2002 | Hayward et al. | |
| 6,396,690 B1 | 5/2002 | Blatti | |
| 6,980,440 B2 * | 12/2005 | Nieman et al. | 361/802 |
| 7,088,583 B2 * | 8/2006 | Brandon et al. | 361/694 |
| 7,113,401 B2 * | 9/2006 | Becker et al. | 361/694 |

* cited by examiner

*Primary Examiner*—Dean A. Reichard
*Assistant Examiner*—Dameon E. Levi
(74) *Attorney, Agent, or Firm*—Wilmer Cutler Pickering Hale and Dorr LLP (57) ABSTRACT

A card guide is used in guiding a circuit board with respect to a chassis. The card guide includes a guide rail extending along the card guide in a first direction, an end portion configured for removably attaching the card guide to the chassis, and a finger extending in a second direction. The finger has a shape and size to allow interconnection with an adjacent card guide. The finger defines an endpoint of a space allowing airflow in a third direction past the card guide.

17 Claims, 10 Drawing Sheets

CARD GUIDE AND METHOD FOR USE IN GUIDING CIRCUIT BOARD WITH RESPECT TO CHASSIS

CROSS-REFERENCE TO RELATED APPLICATIONS

This application claims the benefit of U.S. Provisional Application Ser. No. 60/404,229, entitled HALF CARD GUIDE filed on Aug. 16, 2002, and Continuation U.S. Non-provisional application Ser. No. 10/642,110, filed on Aug. 15, 2003 now U.S. Pat. No. 6,980,440, which are incorporated by reference herein in their entirety.

BACKGROUND

This invention relates to a card guide and method for use in guiding a circuit board with respect to a chassis.

Cards such as printed circuit boards (e.g., telecommunications line cards) are inserted into a computer system (e.g., a communications switch system) for connection to a mating connector within the computer system. When a card is inserted into a computer system for engagement with a connector, a significant degree of guidance is required in order to ensure that the connector is properly seated. The need for guidance is even more critical when the card being inserted has a substantial length. Also, as the number of pins of the mating connectors increases, the potential for damage to these pins is increased if guidance of the card is inadequate upon insertion. These factors also apply upon extraction of a card from a computer system so as to ensure proper disengagement of the mating connectors without damage to the pins of the connectors.

SUMMARY

In an aspect of the invention, a card guide is used in guiding a circuit board with respect to a chassis. The card guide includes a guide rail extending along the card guide in a first direction, an end portion configured for removably attaching the card guide to the chassis, and a finger extending in a second direction. The finger has a shape and size to allow interconnection with an adjacent card guide. The finger defines an endpoint of a space allowing airflow in a third direction past the card guide.

Implementations of the invention may provide one or more of the following advantages. Electronics cards of different sizes may be configured in a chassis. Electronics cards may be inserted and removed without relying on physical support from neighboring cards. Electronics cards may be guided into proper position relative to other cards and the chassis. Leverage assistance may be provided for insertion of electronics cards.

Other advantages and features will become apparent from the following description, including the drawings, and from the claims.

DETAILED DESCRIPTION

A conventional computing system such as a communications system may use multiple removably insertable electronics cards such as printed circuit ("PC") boards. In such a conventional system, rigid card guides are provided for securing the cards in a chassis. The rigid card guides are not removably insertable; accordingly, if the system has a first line card above a second line card, the rigid card guide disposed therebetween is fixed, such that line cards of other (e.g., larger) sizes cannot be accommodated. In such a case, it can be difficult to expand the system or provide the system with more capability or more throughput, since line card space is restricted.

A removable card guide is now described. In at least one embodiment, the removable card guide allows line cards of different sizes to be used. In particular, half size line cards may be used or the removable card guide may be removed so that a line card that is larger than half size may be used, the line card extending further than would be allowed if the removable card guide were not removed. In addition, the removable card guide is removable anywhere within the back side of a chassis for the system, i.e., among a set of interlocking removable card guides that extend from left to right, it is not necessary to remove the card guides in any particular order. The removable card guides do not need to be removed from left to right, or from right to left; one or more middle removable card guides may be removed without first removing any on either left or right side.

The removable card guide is strong enough to support its corresponding electronics card or cards without aid from neighboring removable card guides, which may be absent. Thus, for example, if electronics cards extend from left to right without a last card on the right end, and the corresponding removable card guides are in place without any supportive connection to the right side of the chassis, the removable card guides can support all of the electronics cards. In another example, a removable card guide can support its corresponding electronics card or cards (which may be half size cards) without a removable card guide on either side, e.g., with full size cards on both sides.

In at least one embodiment, each removable card guide is free-standing but is interconnective, such that the removable card guide can physically interconnect with one or more of its adjacent removable card guides.

As described in more detail below, in at least one embodiment, the removable card guide has a shape that facilitates air flow past the removable card guide.

Figure 1A:
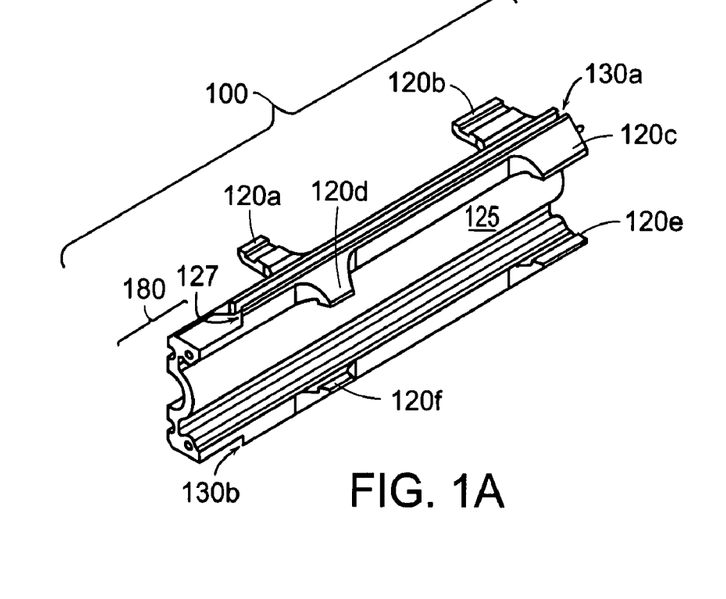
FIGS. 1A, 2A illustrate perspective views of card guide apparatus.
Figure 1B:
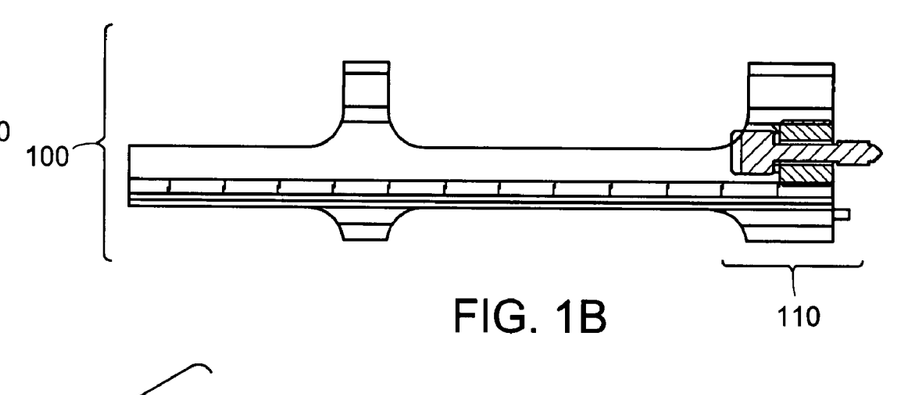
FIGS. 1B, 2B illustrate cross-sectional side views of card guide apparatus.
Figure 1C:
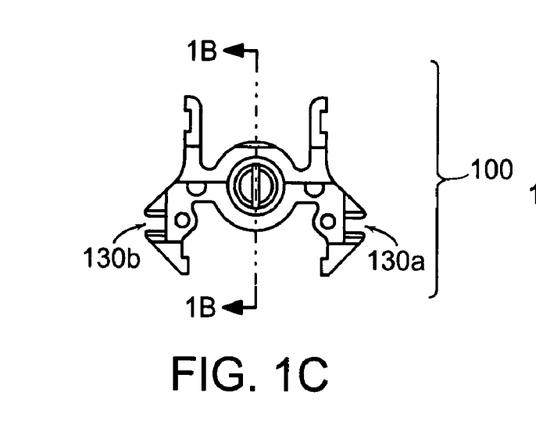
FIGS. 1C, 2C, 3 illustrate end views of card guide apparatus.
Figure 2A:
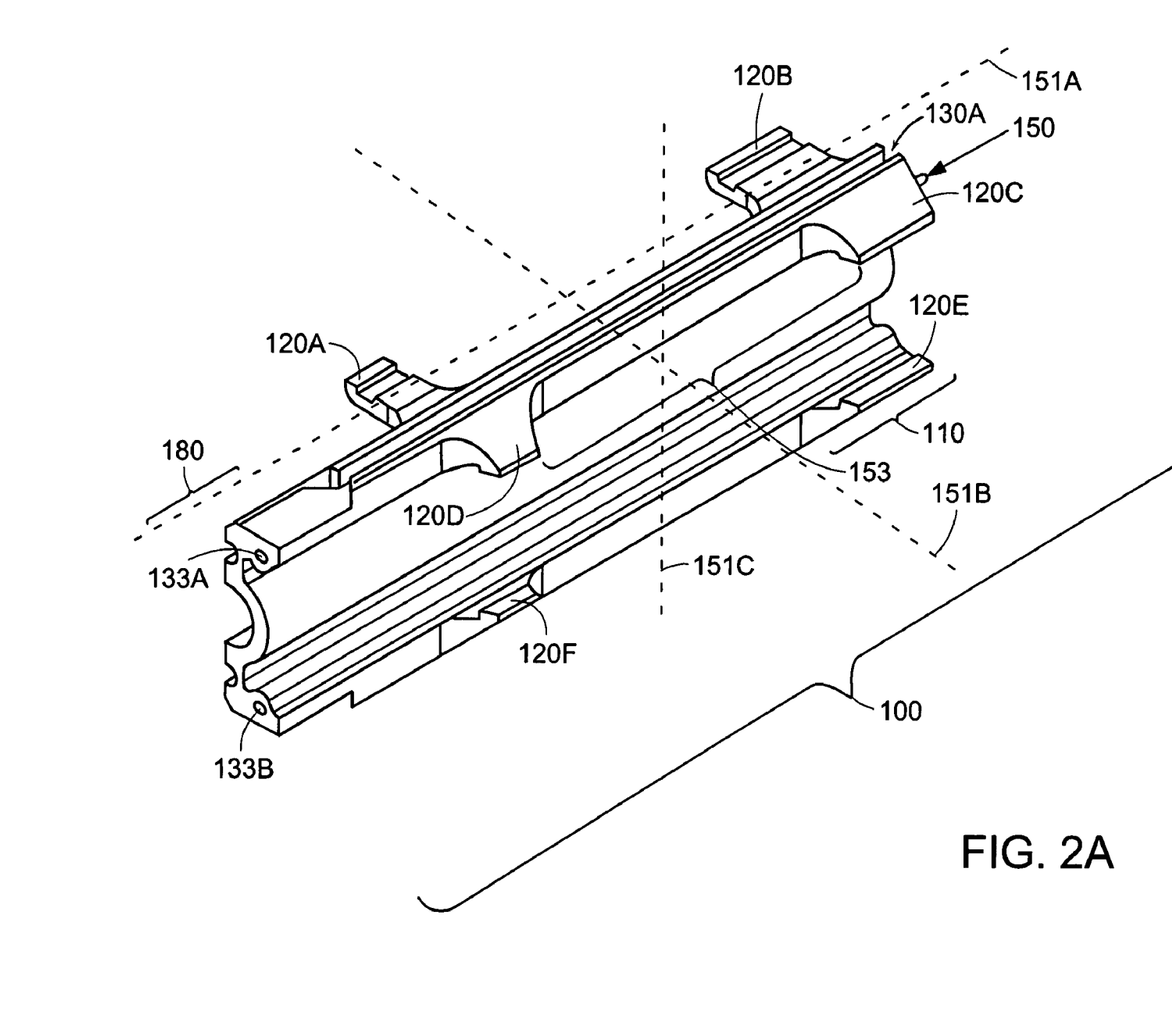

With respect to at least one embodiment now described, FIGS. 1A–1C, 2A–2C, 3 illustrate various views of a bracket 100 that may serve as the removable guide bracket. FIG. 1B illustrates that bracket 100 has an end 110 that is adapted for mounting the bracket into a chassis 400 (FIGS. 5–8). As shown in FIGS. 1A, 2A, bracket 100 has tabs ("fingers") 120A–120F. Bracket 100 also has other tabs 120G, 120H that are not shown in FIGS. 1A, 2A. The tabs of bracket 100 are for connecting to and supporting neighboring or adjacent like brackets, and center card guides ("guide rails") 130A, 130B (FIGS. 1A–1B, 2A–2B) for holding and supporting electronics cards such as line cards on opposite sides of bracket 100.

Figure 2B:
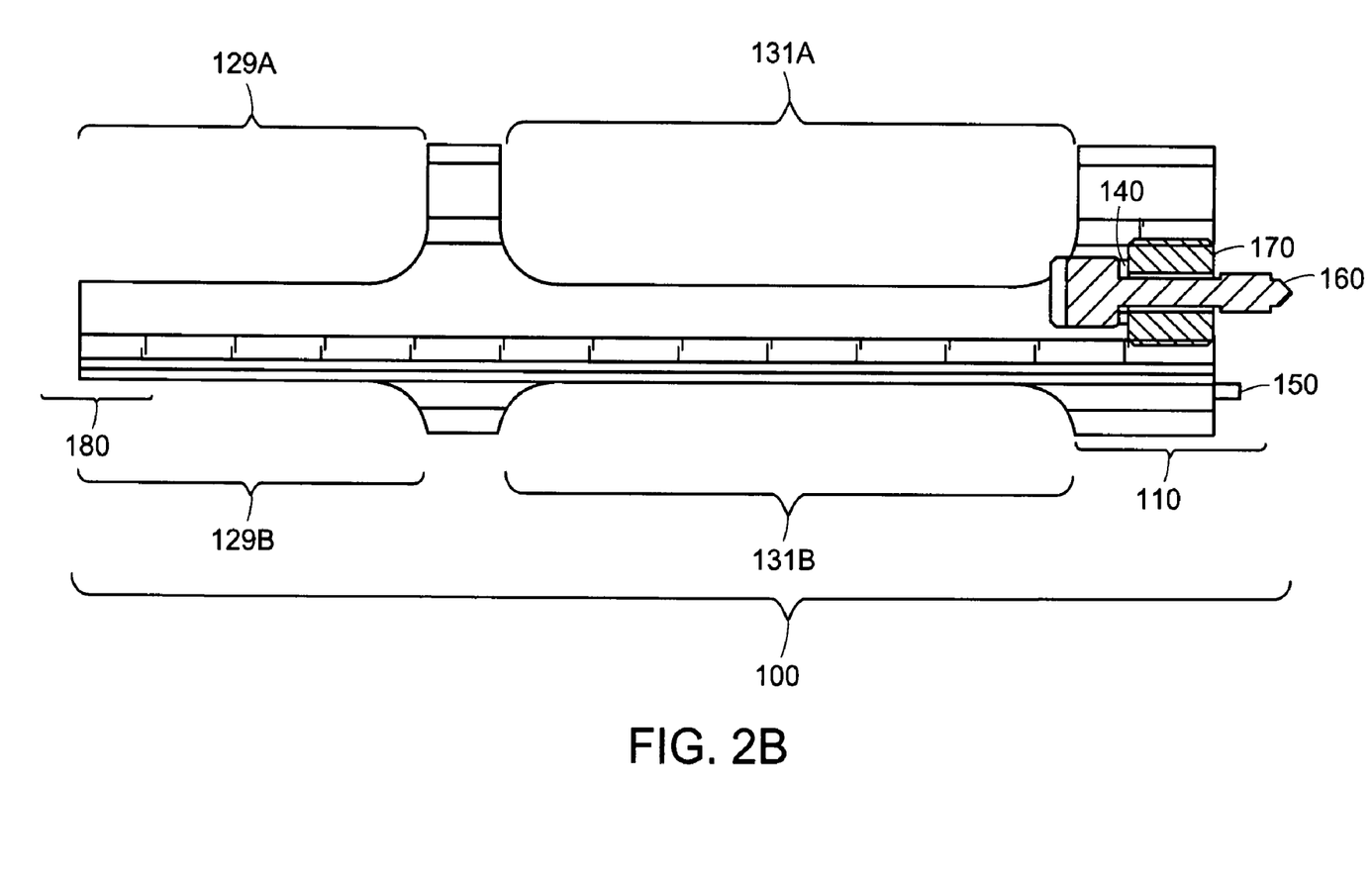

In at least one embodiment, it is advantageous if the bracket is or includes an extrusion made from alloy 6061-T6 and has an electroless nickel finish. In such a case, as shown in FIG. 2B, end 110 may have a lockwasher 140 (#8 regular steel), at least one dowel pin ("guide pin") 150 (McMaster Carr 98380A415), a captive screw 160 (8-32×0.75; RAF 408-S-12), and a knurled fastener 170 (Southco 71-1-232-13).

Figure 4:
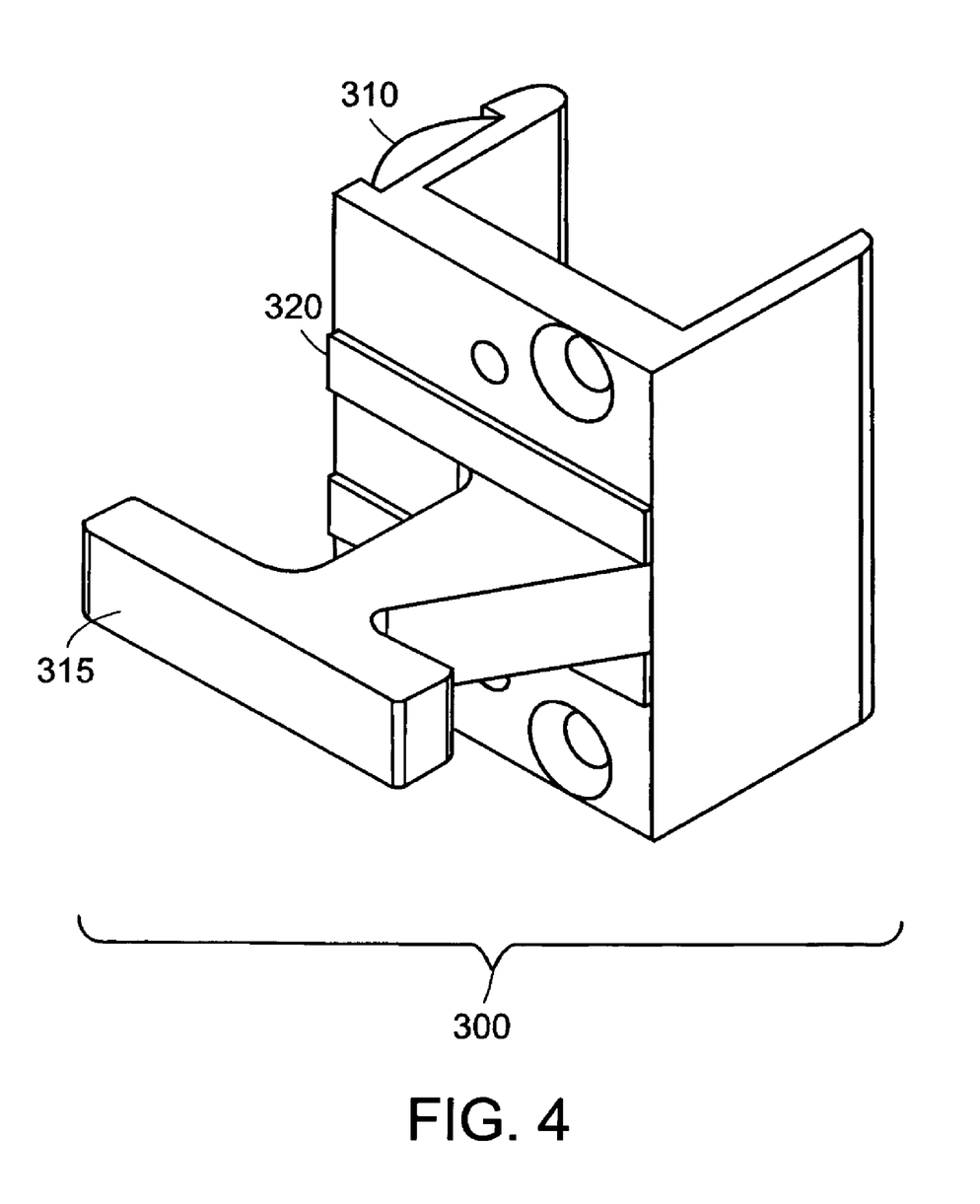
FIG. 4 illustrates a perspective view of end cap apparatus.
Figure 5:
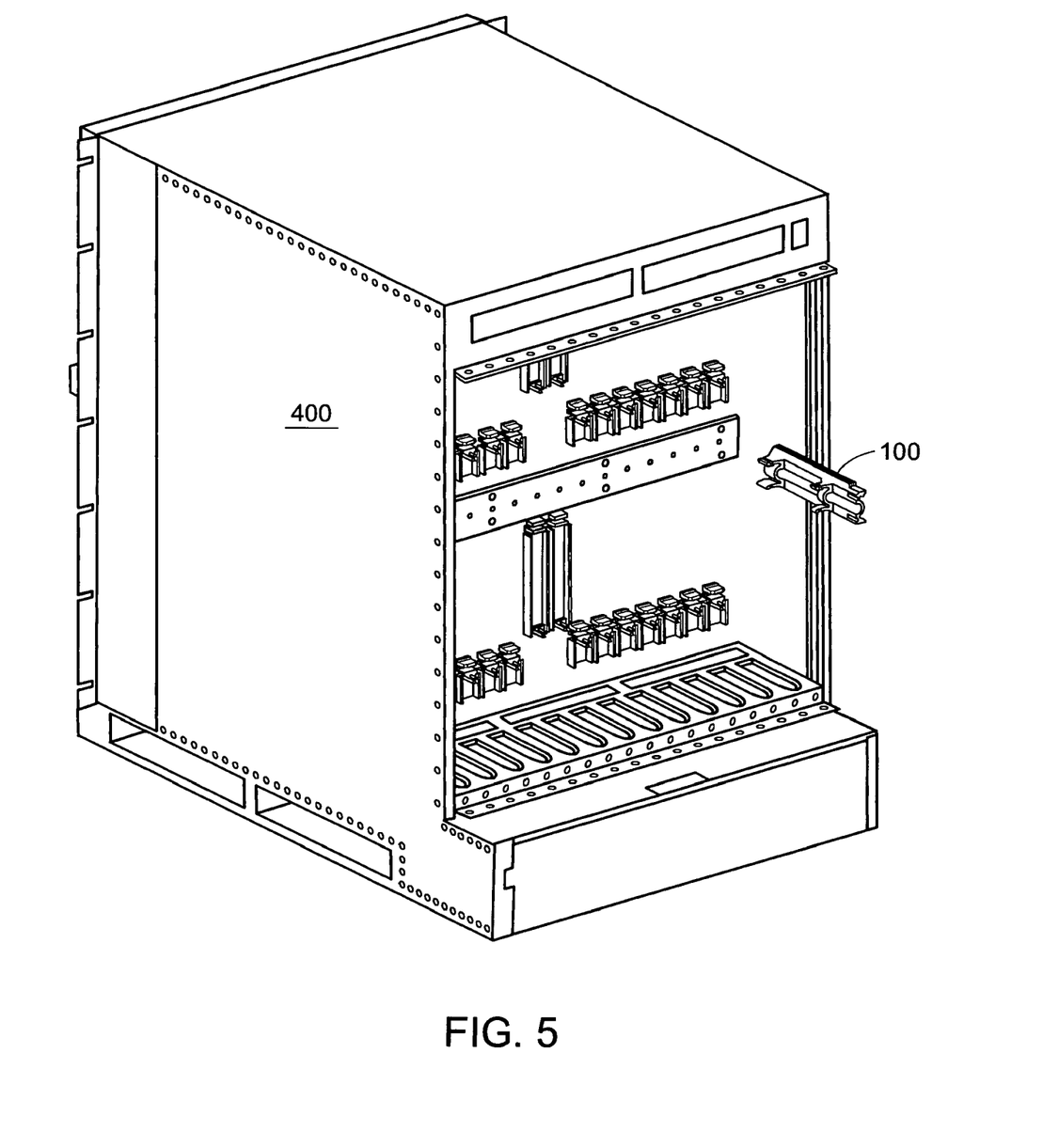
FIGS. 5–8 illustrate card guide and chassis apparatus.
Figure 6:
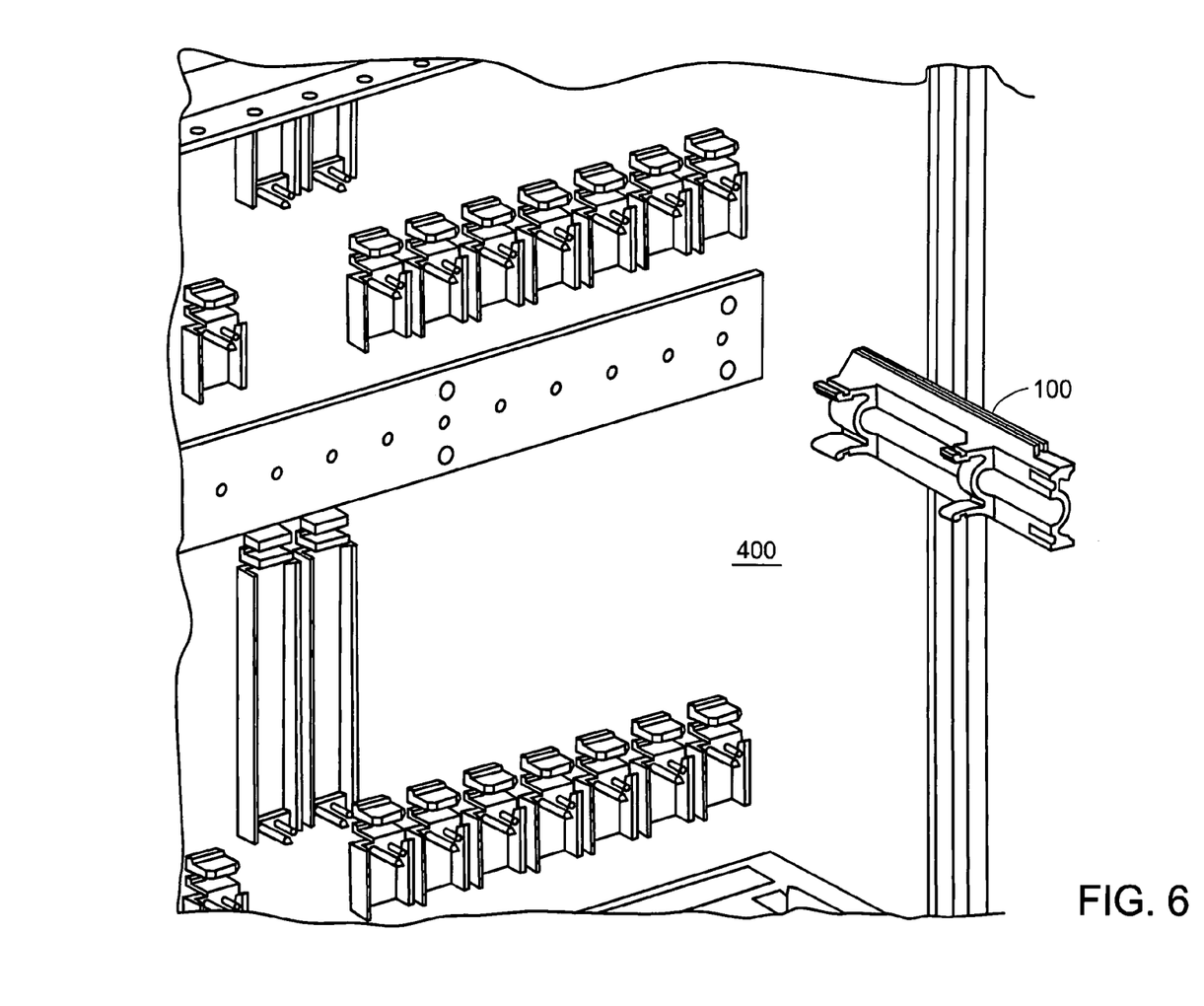
Figure 7:
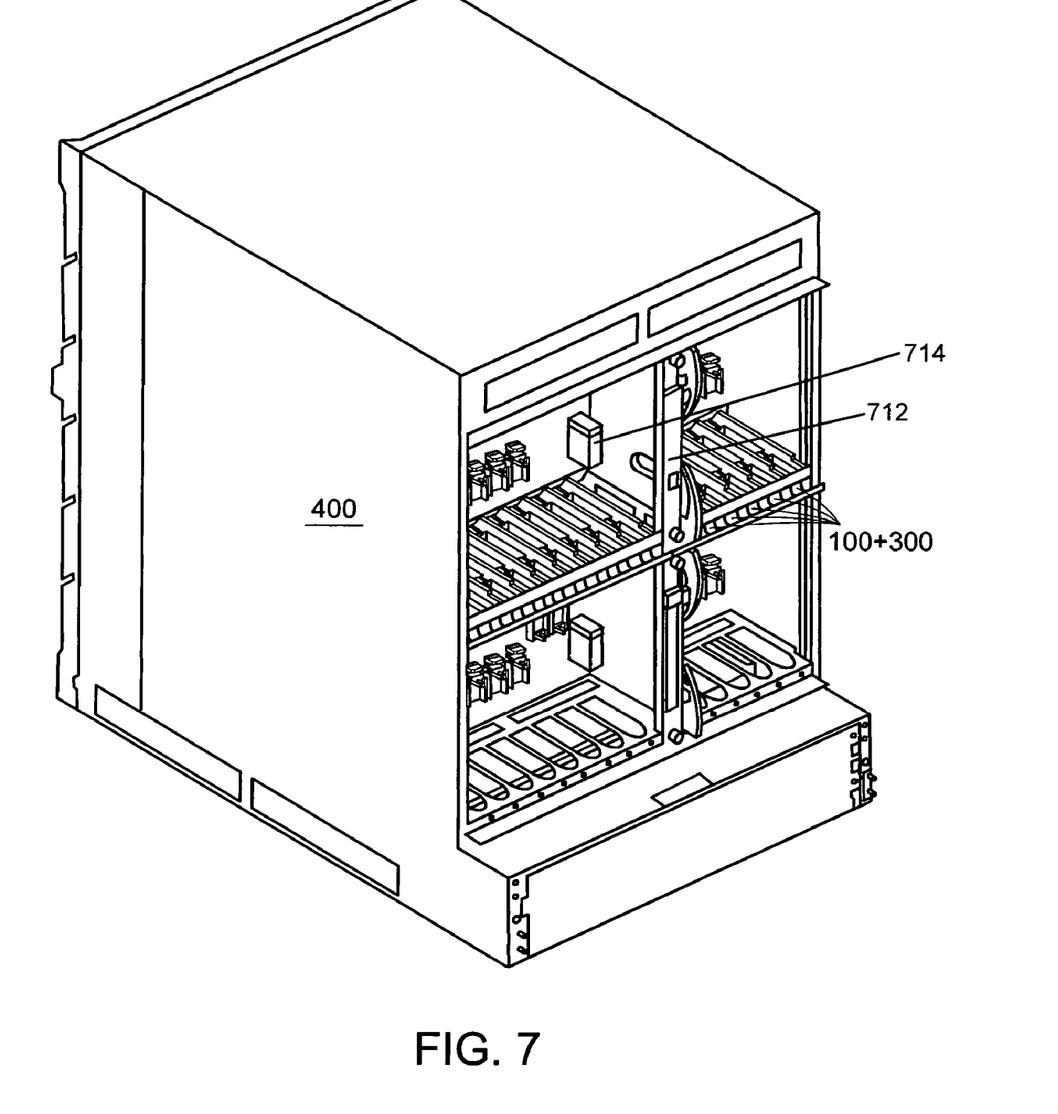
Figure 8:
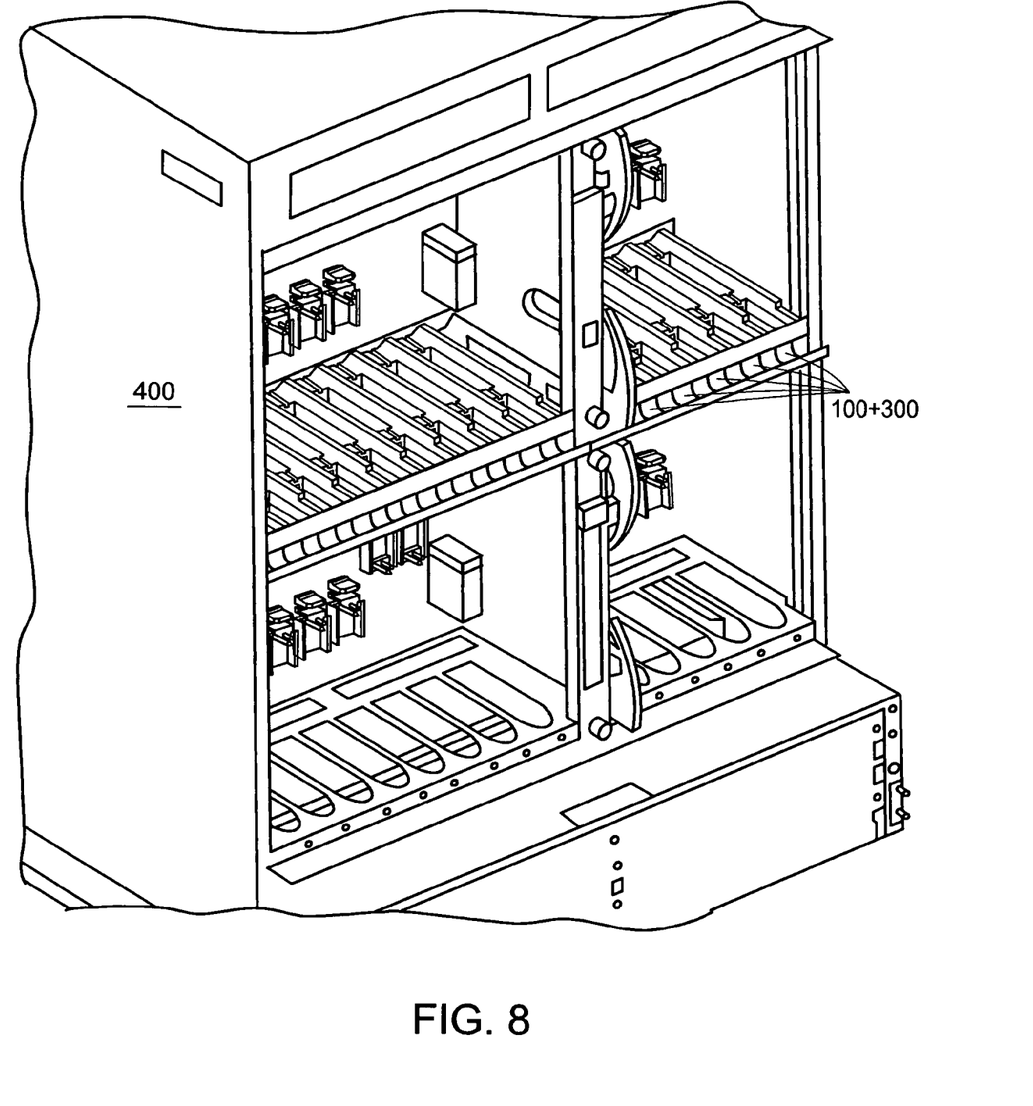

FIG. 4 illustrates an ejector rail member (end cap) 300 that attaches to an ejector rail end 180 of bracket 100. In at least one embodiment, it is advantageous if member 300 has a soft-shield 5000 member 310 (Chromerics 82-122-74074-00131) and a 5000 SS gasket 320 (Chromerics 82-122-74039-00103).

Bracket 100 mounts into a metal rail of chassis 400 by a screw attachment with end 110 of bracket 100 mating by screw 160 to the metal rail. Fastener 170 at end 110 may be or include a trim nut to which the screw mates to hold bracket 100 in place.

Two guide pins 150 (FIGS. 2A–2B, 3) on bracket 100 align to two holes on the metal rail and help keep the bracket from rotating clockwise or counterclockwise. Guide pins 150 also help to align bracket 100 with one or more other brackets so that corresponding electronics cards can slide in and out smoothly and so that corresponding electronics cards are guided into desired angles (e.g., parallel or at right angles to each other). If bracket 100 were not aligned with another bracket in contact with another edge of the same electronics card (e.g., if guide pins 150 were absent), the electronics card might need to be undesirably bent during insertion.

In addition, as shown in FIGS. 1A, 1C, top and bottom card guide rails 130A, 130B are disposed above and below a main barrel area 125 of bracket 100, and fingers 120A–120H extend from barrel area 125 to interconnect with one or more adjacent brackets. Entrance points (e.g., entrance point 127) to card guide rails 130A, 130B are funnel shaped to help guide electronics cards into rails 130A, 130B.

Fingers 120C, 120D are pointed down slightly and fingers 120A, 120B are pointed up. Adjacent brackets interconnect by sliding parallel to each other. In a chassis, a newly inserted bracket interconnects with adjacent already present brackets by sliding into the chassis. Corresponding fingers such as fingers 120C, 120D and fingers 120A, 120B have substantially the same width at their contact areas so that the full or nearly the full structural strength of each finger is provided for supportive interconnection.

Barrel area 125 has a cylinder shape having features formed at least in part by milling portions from an extrusion, which is done at least in part to facilitate air flow. FIG. 2B illustrates that spaces 129A, 129B, 131A, 131B are created by milling out material to leave fingers 120–120H.

Cylinder-shaped barrel area 125 is open such that an installer may insert a screwdriver, guided by barrel area 125, to turn a screw to secure the bracket to the chassis' metal rail, such that the bracket may be detached from the rail by removing the screw.

Figure 2C:
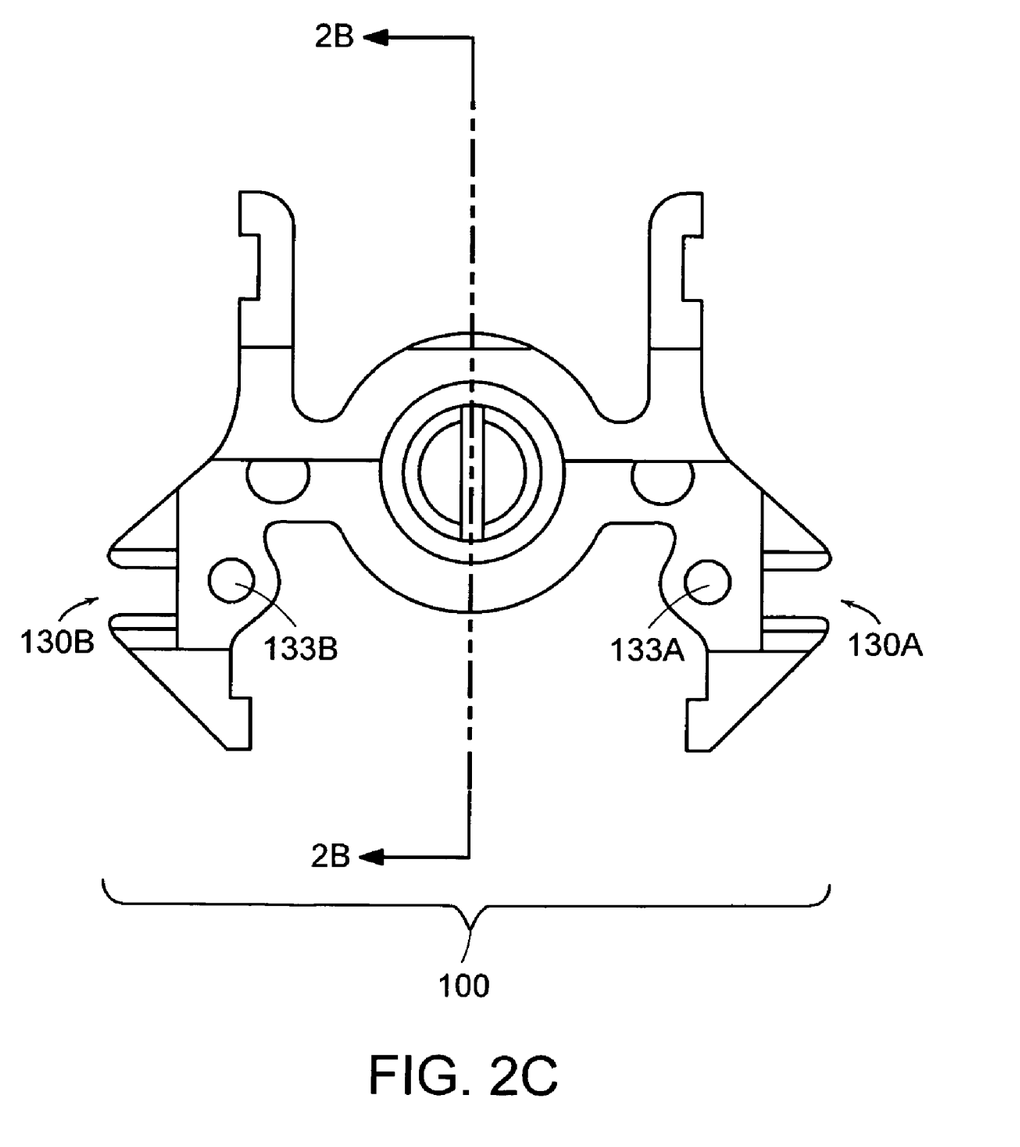
Figure 3:
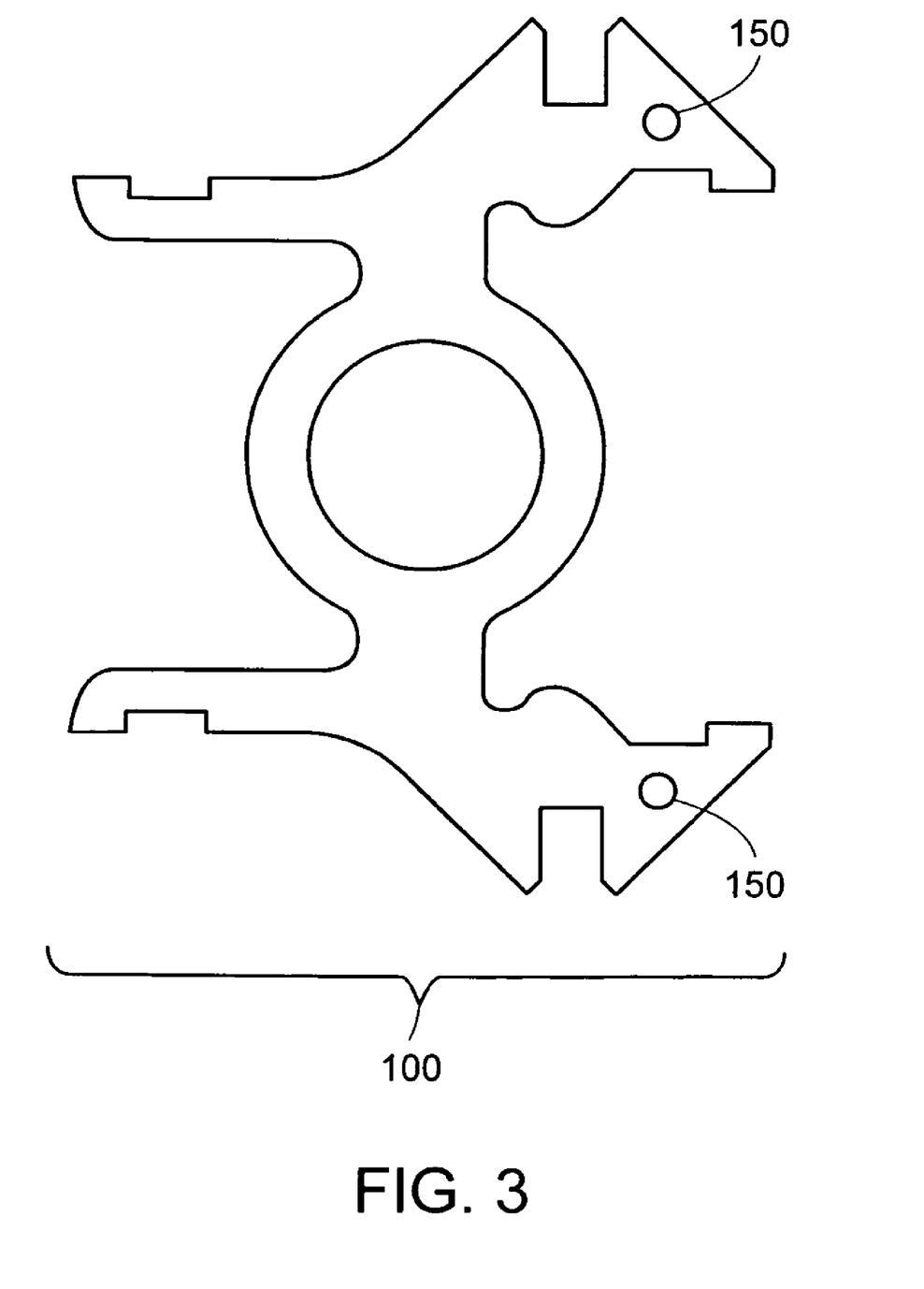

In at least one embodiment, as illustrated in FIGS. 2A, 2C, bracket 100 may also include screw holes 133A, 133B at end 180 of bracket 100 that protrudes from the chassis. Screw holes 133A, 133B allow end cap 300 (FIG. 4) to be attached on the end of the bracket. End cap 300 is used with one or more lever locks on the electronic cards to facilitate insertion of the electronic card into the chassis. End cap has a hook 315 with which the lever lock interacts when the electronics card is inserted into the chassis. For example, the electronics card may require at least 100 pounds of force to put in, and the lever lock and end cap facilitate such insertion using leverage.

In an example embodiment of the chassis, air comes from the bottom of the chassis, is forced up, and is pulled out the top of the chassis. As noted above, bracket 100 includes features for facilitating such airflow. As described above, areas 129A, 129B, 131A, 131B are milled out to allow airflow past fingers 120A–120H. The location of one or more of fingers 120A–120H also facilitates airflow. For example, fingers 120B, 120C, 120E are located where it is expected that airflow is already hindered by components on the corresponding electronics cards, so that the fingers block little or no airflow that is not already otherwise blocked. For example, in the embodiment shown in FIG. 7, at least one finger of the bracket 100 supporting circuit board 712 is co-located in the vertical direction with a component 714 projecting from circuit board 712 which already significantly blocks airflow. In another particular example, the fingers are co-located with half-inch mid-point connectors on the electronic cards which already significantly block airflow.

In a specific embodiment, one or more of fingers 120B, 120C, 120E has a width that does not extend fully to be flush with the portion of end 110 that contacts the chassis rail.

In at least one embodiment, it is advantageous if bracket 100 is nickel plated or nickel silver plated, which provides a smooth exterior to bracket 100 to facilitate the sliding in and out of electronics cards. In at least some cases, an unplated aluminum bracket is rough and can bind up on electronics cards.

Bracket 100 may be made by extruding a long piece that is cut into pieces, each piece being the length of one bracket and being milled and drilled to be provided with features described herein. For example, screw holes 133A, 133B are drilled in, and guide pins 150 are formed by drilling out holes and pressing in pins. Fastener 170 has teeth on its outer circumference that engage and interlock with corresponding teeth on bracket 100 when fastener 170 is pressed in.

As shown in FIG. 2A, guide rail 130A extends along bracket 100 in a direction 151A. End portion 110 is configured for removably attaching bracket 100 to the chassis. Finger 120C extends in direction 151B and has a shape and size to allow interconnection with an adjacent bracket. Finger 120C defines an endpoint of a space 153 allowing airflow in direction 151C past bracket 100.

Other embodiments are within the scope of the following claims. For example, bracket 100 or end cap 300 may be made of or include open sheet metal, molded plastic or other plastic, or ceramic.

What is claimed is:

1. A card guide for use in guiding a circuit board with respect to a chassis, the card guide comprising:
    a guide rail extending along the card guide in a first direction;
    an end portion configured for removably attaching the card guide to the chassis; and
    a finger extending in a second direction, the finger having a shape and size to allow interconnection with an adjacent card guide, the finger defining an endpoint of a space allowing airflow in a third direction past the card guide when the finger is interconnected with the adjacent card guide.

2. The card guide of claim 1 further comprising one or more additional fingers, each having a shape and size to allow interconnection with an adjacent card guide, and each defining an endpoint of a space allowing airflow in a third direction past the card guide.

3. The card guide of claim 2 wherein said fingers extend from generally opposite sides of said guide rail, said fingers extending from one side of said guide rail pointing generally upwardly and said fingers extending from the generally opposite side of said guide rail pointing generally downwardly, wherein said fingers pointing generally upwardly are interconnectable with corresponding generally downwardly pointing fingers of an adjacent card guide, and said fingers pointing generally downwardly are interconnectable with corresponding generally upwardly pointing fingers of another adjacent card guide.

4. The card guide of claim 1 wherein, when said circuit board is secured in said chassis by said card guide, said finger is co-located in said third direction with a component projecting from said circuit board.

5. The card guide of claim 1 wherein said card guide supports said circuit board without aid from said adjacent card guide.

6. The card guide of claim 1 further comprising at least one guide pin projecting outwardly from said end portion and engageable with said chassis for orienting said guide rail with respect to said chassis.

7. The card guide of claim 1 wherein said guide rail comprises aluminum.

8. The card guide of claim 1 wherein said guide rail is nickel or nickel-silver plated.

9. The card guide of claim 1 further comprising a lever lock mechanism at an end of said guide rail opposite said end portion, said lever lock mechanism for facilitating insertion and removal of said circuit board in said card guide.

10. A system for holding a plurality of circuit boards, comprising:
 a chassis; and
 a plurality of card guides, each comprising:
  (a) a guide rail removably attached at an end of said guide rail to said chassis, said guide rail slidingly receiving a circuit board during insertion of said circuit board in said system and for supporting said circuit board; and
  (b) at least one projection extending from each of two generally opposite sides of said guide rail, said at least one projection being interconnectable with a corresponding at least one projection of an adjacent card guide, said projections and the guide rails of adjacent card guides defining at least one space between adjacent card guides for flow of air therethrough.

11. The system of claim 10 wherein for each card guide, said at least one projection extending from one side of said guide rail points generally upwardly and said at least one projection extending from the generally opposite side of said guide rail points generally downwardly, wherein said at least one projection pointing generally upwardly is interconnectable with corresponding at least one generally downwardly pointing projection of an adjacent card guide, and said at least one projection pointing generally downwardly is interconnectable with corresponding at least one generally upwardly pointing projection of another adjacent card guide.

12. The system of claim 10 wherein for each card guide that is supporting a circuit board, said at least one projection is co-located with an outwardly extending component on said circuit board.

13. The system of claim 1 wherein each card guide supports a circuit board without support from an adjacent card guide.

14. The system of claim 10 further comprising for each card guide, at least one guide pin projecting from said end and engageable with said chassis for orienting said guide rail with respect to said chassis.

15. The system of claim 10 wherein for each card guide, said guide rail comprises aluminum.

16. The system of claim 10 wherein for each card guide, said guide rail is nickel or nickel-silver plated.

17. The system of claim 10 further comprising for each card guide, a lever lock mechanism at an end of said guide rail opposite said end, said lever lock mechanism for facilitating insertion and removal of said circuit board in said card guide.

* * * * *